United States Patent [19]
Fukuda et al.

[11] Patent Number: 6,148,762
[45] Date of Patent: Nov. 21, 2000

[54] PLASMA PROCESSING APPARATUS

[75] Inventors: Koichi Fukuda, Miyagi-ken, Japan; Sung Chul Kim, Kyongki-Do, Rep. of Korea; Akira Nakano, Miyagi-ken, Japan

[73] Assignee: Frontec Incorporated, Miyagi-ken, Japan

[21] Appl. No.: 09/246,245

[22] Filed: Feb. 8, 1999

[30] Foreign Application Priority Data

Feb. 17, 1998 [JP] Japan ................................. 10-035189

[51] Int. Cl.⁷ ................................................. C23C 16/00
[52] U.S. Cl. ........................... 118/715; 118/728; 118/729; 414/935
[58] Field of Search ..................................... 118/715, 728, 118/729, 118; 414/935

[56] References Cited

U.S. PATENT DOCUMENTS

| | | | |
|---|---|---|---|
| 5,558,717 | 9/1996 | Zhao et al. | 118/715 |
| 5,848,670 | 12/1998 | Salzman | 187/272 |
| 5,935,334 | 8/1999 | Fong et al. | 118/723 ME |

*Primary Examiner*—Harold Pyon
*Assistant Examiner*—Liza Pacheco
*Attorney, Agent, or Firm*—Brinks Hofer Gilson & Lione

[57] ABSTRACT

A plasma processing apparatus for stably and uniformly performing various kinds of processing by preventing unnecessary plasma discharge in the processing comprises a susceptor pin for supporting a substance to be processed, the susceptor pin being disposed to pass through a hole formed to a susceptor, projecting from the upper surface of the susceptor when the susceptor falls and falling by its own weight when the susceptor rises so as to be buried in the hole, and a guide for guiding the rising and falling directions of the susceptor pin, wherein the susceptor pin and the guide are composed of ceramics.

6 Claims, 4 Drawing Sheets

PROIR ART

PLASMA PROCESSING APPARATUS

BACKGROUND OF THE INVENTION

1. Field of the Invention

The present invention relates to a plasma processing apparatus, and more specifically, to a plasma processing apparatus for preventing unnecessary plasma discharge in the apparatus.

2. Description of the Related Art

Plasma processing apparatuses are used to a CVD apparatus, a dry etching apparatus and the like in a process for manufacturing, for example, an liquid crystal display device. The Plasma processing apparatus will be described below using the CVD apparatus as an example.

Conventional cut-sheet type plasma CVD apparatuses include a chamber for forming a film on the surface of a substance to be processed such as a substrate or the like using a reaction gas introduced into it, a susceptor disposed in the chamber for supporting the substance to be processed and a plurality of susceptor pins accommodated in holes formed to the susceptor.

FIG. 5 is a sectional view showing an example of the susceptor pin used in the conventional plasma CVD apparatus. The susceptor pin 1 is schematically composed of a pin main body 1a, an upper shaft 1b, a lower shaft 1c, and a spring 1d. The core of the pin main body 1a is composed of aluminum and the periphery of the core is coated with alumina. The upper shaft 1b is a circular cylindrical body composed of hastelloy, and an enlarged diameter section is formed to the upper end of the upper shaft 1b. The lower end of the pin main body 1a is fixed to the enlarged diameter section at the upper end of the upper shaft 1b. The lower shaft 1c is a circular cylindrical body composed of ceramics, an enlarged diameter section is formed to the upper end of the lower shaft 1c, and a recess is formed to the upper surface of the enlarged diameter section. The lower end of the upper shaft 1b is threaded into the hole formed to the bottom surface of the recess formed to the lower shaft 1c and fixed in the hole. The spring 1d is disposed around the upper shaft 1b.

The susceptor pin 1 is accommodated in the hole 3 formed to a susceptor 2. The susceptor 2 is composed of a heating plate 4 for heating the substrate to be heated, a heater 5, and a susceptor shield 6. A gap 7 is defined between the heater 5 and the susceptor shield 6 in view of expansion caused by the heating of the heater 5. A guide 8 is disposed to the inner wall surface of the hole 3 for guiding the rising and falling directions of the susceptor pin.

Next, the operation of the susceptor pin 1 will be described. As shown in FIG. 5, the spring 1d is extended in an ordinary state so that the extreme end of the pin main body 1a is accommodated in the hole 3 of the susceptor 2. When the lower shaft 1c is pushed up from a lower position in the figure, the spring 1d is contracted to thereby project the extreme end of the pin main body 1a from the upper surface of the susceptor 2. When the force for pushing up the lower shaft 1c is released, the spring d returns to its original position and the extreme end of the pin main body 1a is accommodated in the hole 3 of the susceptor 2.

A procedure for forming a film on the surface of the substrate to be processed using the conventional cut-sheet type plasma CVD apparatus will be described.

First, the substrate to be processed is loaded into the chamber by a robot arm or the like in the state that the susceptor pin projects from the upper surface of the susceptor and supported on the susceptor pin. Thereafter, the susceptor pin is accommodated in the hole of the susceptor and the substrate to be processed is placed on the susceptor.

Next, a film is formed on the surface of the substrate to be processed, and after the film is formed, the susceptor pin projects from the upper surface of the susceptor, and the substrate to be processed moves from the susceptor onto the susceptor pin. In this state, the substrate to be processed is unloaded by the robot arm or the like.

When a CVD reaction is performed using the conventional plasma CVD apparatus, since metal components such as the upper shaft 1b, the spring 1d and the like exist in the vicinity of the susceptor pin 1, plasma discharge may arise from these metal components. The inventors have actually confirmed that plasma discharge arises from the lower portion of the susceptor pin toward the bottom surface of the chamber while a CVD job is performed. As a result, there is a problem that a reactant deposited on the susceptor pin causes the defective operation of the susceptor when it rises and falls and the operation failure of the apparatus is caused by the defective operation of the susceptor. Further, there is also caused such problems in the formation of a film that a speed at which the film is formed on the substrate to be processed is lowered, the quality of the film is deteriorated and the in-plane distribution of the film is made uneven. Further, there is a possibility that plasma leaks from the gap 7.

Although the plasma processing apparatus has been described above as to the case that it is used to the CVD apparatus, plasma discharge also arises when the plasma processing apparatus is used to the dry etching apparatus because the susceptor pin has the same structure. Accordingly, there is a possibility that etching cannot be stably performed by the occurrence of the same problem.

SUMMARY OF THE INVENTION

In view of the above problems, an object of the present invention is to provide a plasma processing apparatus capable of stably and uniformly performing various kinds of processing by preventing unnecessary plasma discharge in the processing.

A plasma processing apparatus of the present invention comprises a susceptor pin for supporting a substance to be processed, the susceptor pin being disposed to pass through a hole formed to a susceptor, projecting from the upper surface of the susceptor when the susceptor falls and falling by its own weight when the susceptor rises so as to be buried in the hole, and a guide for guiding the rising and falling directions of the susceptor pin, wherein the susceptor pin and the guide are composed of ceramics.

Since the susceptor pin is composed of the insulating alumina, the plasma discharge from the susceptor pin can be prevented as well as a reactant can be prevented from being deposited on the susceptor pin. Since the susceptor pin falls by its own weight as the susceptor rises, a spring which is used conventionally to return the position of the susceptor pin to an initial state when the susceptor rises can be made unnecessary. Further, the provision of the ceramic guide can ease the electric field between the guide and the susceptor pin and is more effective to the prevention of plasma discharge.

Alumina, quartz glass, aluminum nitride, etc. can be exemplified here as a material capable of being used as the ceramics.

The susceptor pin may be composed of a pin main body and a shaft engaged with the pin main body so that the shaft can be adjusted to freely expand and contract. In this case, the height of the susceptor pin can be adjusted by adjusting the engaging state of the pin main body with the shaft as well as even if the pin main body is damaged, the damage can be easily repaired by replacing only the pin main body.

An expanded diameter portion may be formed to the shaft by expanding a part of the shaft, the guide may be composed of an upper guide and a lower guide detachably attached to the upper guide, and a stopper may be disposed to the lower guide so that the stopper is abutted against and supports the shaft when the susceptor pin falls. Since the guide is divided into the upper portion and the lower portion, the susceptor pin having the shaft to which the enlarged disposed portion is formed can be easily mounted on the susceptor.

It is preferable that a plasma leakage preventing member is disposed to the space formed by the susceptor, the guide and a susceptor shield disposed to the lower portion of the susceptor. With this operation, the leakage of plasma from the space, where plasma may leak in the conventional structure, can be prevented by plasma leakage preventing member which seals the space.

Further, it is preferable that a cap is disposed to the upper end of the susceptor pin to close the hole of the susceptor when the susceptor pin falls. With this arrangement, the reliability in operation of the susceptor pin can be improved by making it difficult for dust and pieces of a reactant to enter the hole through which the susceptor pin passes. At the same time, the electric potential of the cap can be made equal to the electric potential of the susceptor when they are in contact with each other by the arrangement that the cap comes into electrical contact with the susceptor in the state that susceptor pin falls, whereby the discharge between the cap and the susceptor can be prevented.

DESCRIPTION OF THE PREFERRED EMBODIMENT

An embodiment of the present invention will be described below in detail with reference to the accompanying drawings. However, the present invention is by no means limited only to the embodiment.

Figure 1:
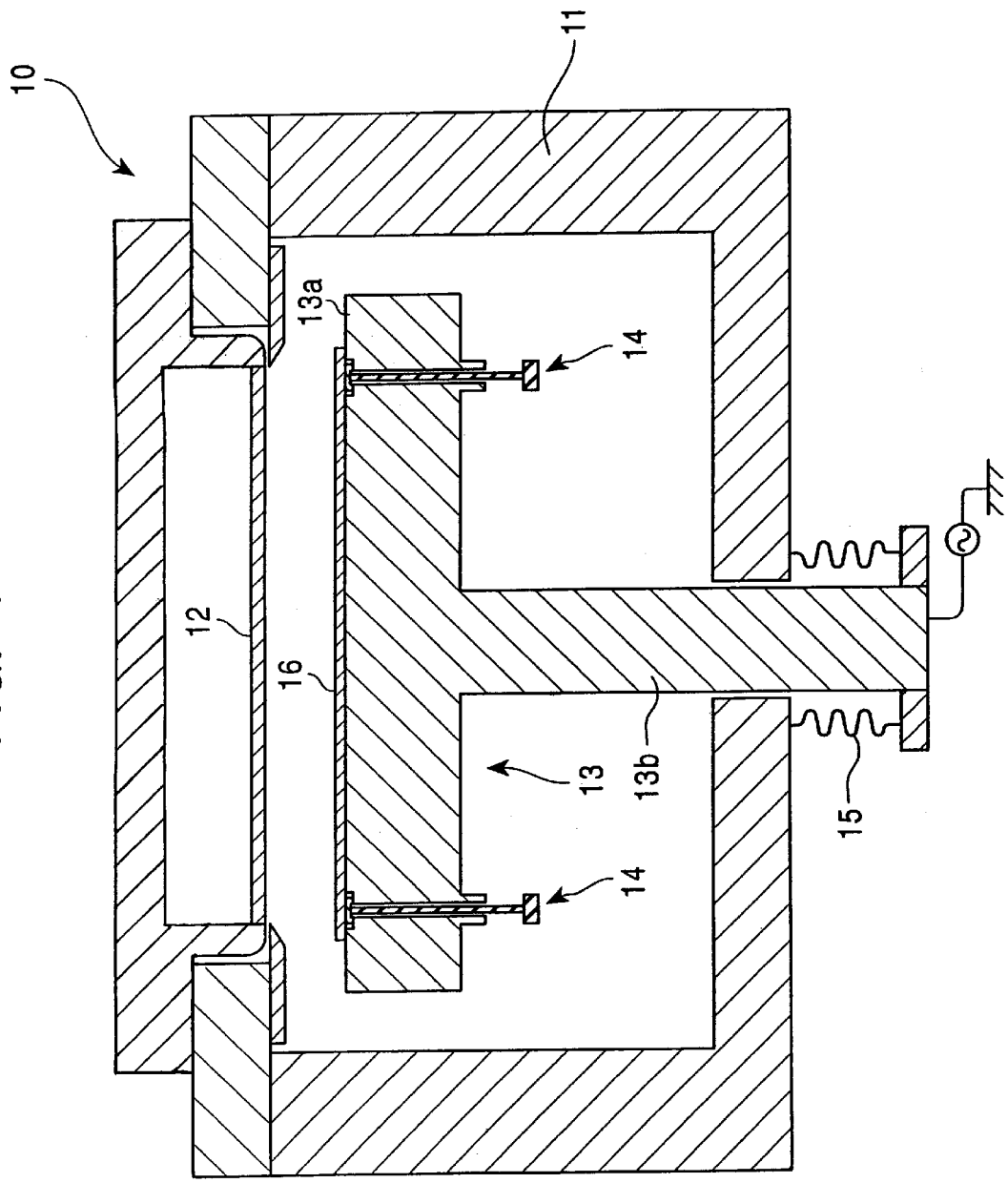
FIG. 1 is a sectional view showing a plasma CVD apparatus of an embodiment of the present invention.
Figure 2:
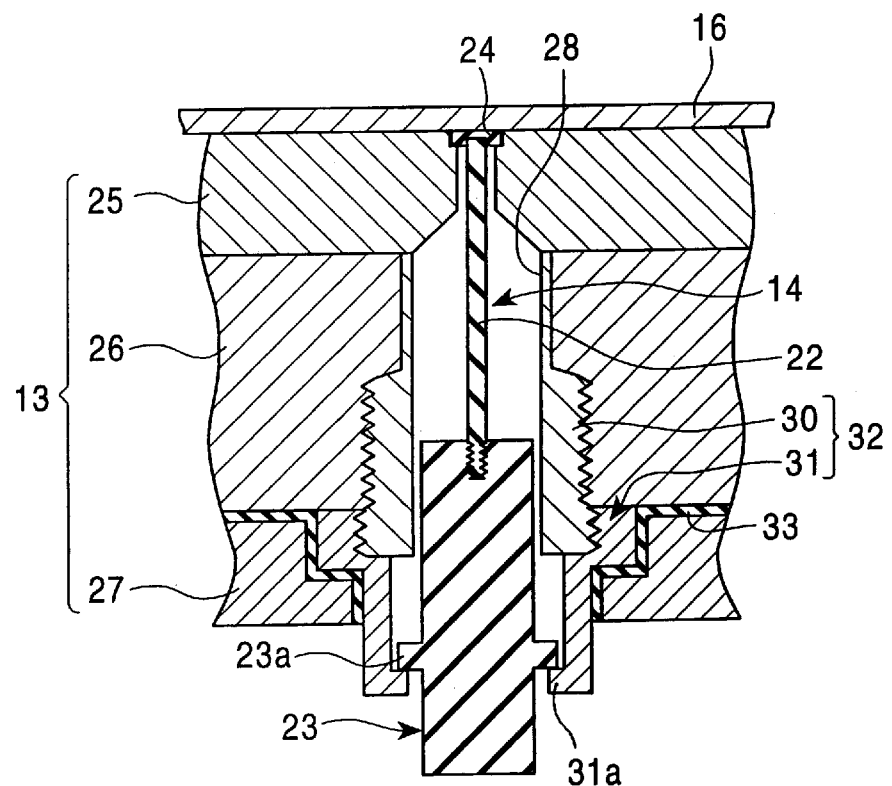
FIG. 2 is a sectional view showing the susceptor pin section of the plasma CVD apparatus.

FIG. 1 is a sectional view showing a plasma CVD apparatus (plasma processing apparatus) of the embodiment, and FIG. 2 is a sectional view showing the susceptor pin section of the plasma CVD apparatus.

As shown in FIG. 1, the plasma CVD apparatus 10 is schematically composed of a chamber 11, an RF electrode 12, a susceptor 13, a susceptor pin 14 and a bellows 15 for moving the susceptor 13 up and down while keeping the interior of the chamber 11 to a pressure reduced state.

The chamber 11 is formed to a hollow rectangular-prism-shape and the RF electrode 12 is disposed to the upper portion thereof. The susceptor 13 is composed of a rectangular-prism-shaped stage 13a accommodated in the chamber 11 and a susceptor shaft 13b which is disposed on the lower surface of the stage 13a and extends to the outside of the 11 passing through the bottom plate of the chamber 11. A substrate 16 (substance to be processed) is held on the upper surface of the stage 13a. A plurality of holes are formed to the portion of the stage 13a where the substrate 16 is placed, the holes passing through the stage 13a in its thickness direction, and the susceptor pins 14, 14—are disposed in the holes, respectively. A not shown gas introducing port is formed to the chamber 11 to introduce a gas used to forming a film into the chamber 11.

As shown in FIG. 2, the susceptor pin 14 is schematically composed of a pin main body 22 and a shaft 23. Both the pin main body 22 and the shaft 23 are composed of alumina, and the lower end of the pin main body 22 is engaged with a hole formed to the upper end of the shaft 23 so that pin main body 22 can be adjusted to freely expand and contract.

The susceptor pin 14 is accommodated in the hole formed to the susceptor 13 which is composed of a heating plate 25, a heater 26 and a susceptor shield 27. The shaft 23 has a weight which is sufficient for the shaft 23 to fall into the hole 28 by its own weight in the state that the susceptor 13 rises. An upper guide 30 and a lower guide 31 each composed of alumina are disposed to the inner wall surface of the hole 28 for guiding the rising and falling directions of the susceptor pin 14, and a guide 32 is composed of the upper guide 30 and the lower guide 31. The lower guide 31 is detachably threadably attached to the upper guide 30. The lower guide 31 has a stopper 31a at the lower end of it which projects toward the interior of the hole 28. The stopper 31a is abutted against and supports an enlarged diameter portion 23a which is disposed at a position in the vicinity of the center of the shaft 23.

A space formed by the heater 26, the susceptor shield 27 and the lower guide 31 is filled with a plasma leakage preventing member 33 which prevents the leakage of plasma, acts as a shock absorber when the heater 26 expands, and at the same time maintains an insulated state. The plasma leakage preventing member 33 is composed of ceramics such as alumina, aluminum nitride, etc.

Figure 3:
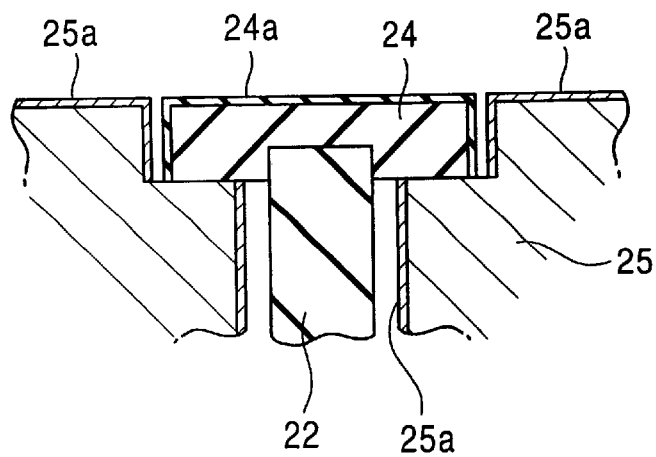
FIG. 3 is a sectional view showing the extreme end of the susceptor pin of the plasma CVD apparatus.

FIG. 3 is a sectional view showing the extreme end of the susceptor pin of the plasma CVD apparatus. A cap 24 is disposed to the extreme end of the pin main body 22 of the susceptor pin 14 to close the opening of the hole 28. The core of the cap 24 is composed of aluminum and the periphery of the core is coated with alumina 24a. The upper end of the pin main body 22 is engaged with the recess formed to the bottom surface of the cap 24. The periphery of the aluminum constituting the heating plate 25 is coated with alumina 25a likewise the cap 24. As shown in FIG. 3, the portions of the cap 24 and the heating plate 25 where they are in contact with each other are not coated with alumina so that the surfaces of them composed of aluminum directly come into contact with each other.

Next, the motion of the susceptor pin 14, when the susceptor 13 moves, will be described with reference to FIG. 1, FIG. 2 and FIG. 4.

Figure 4:
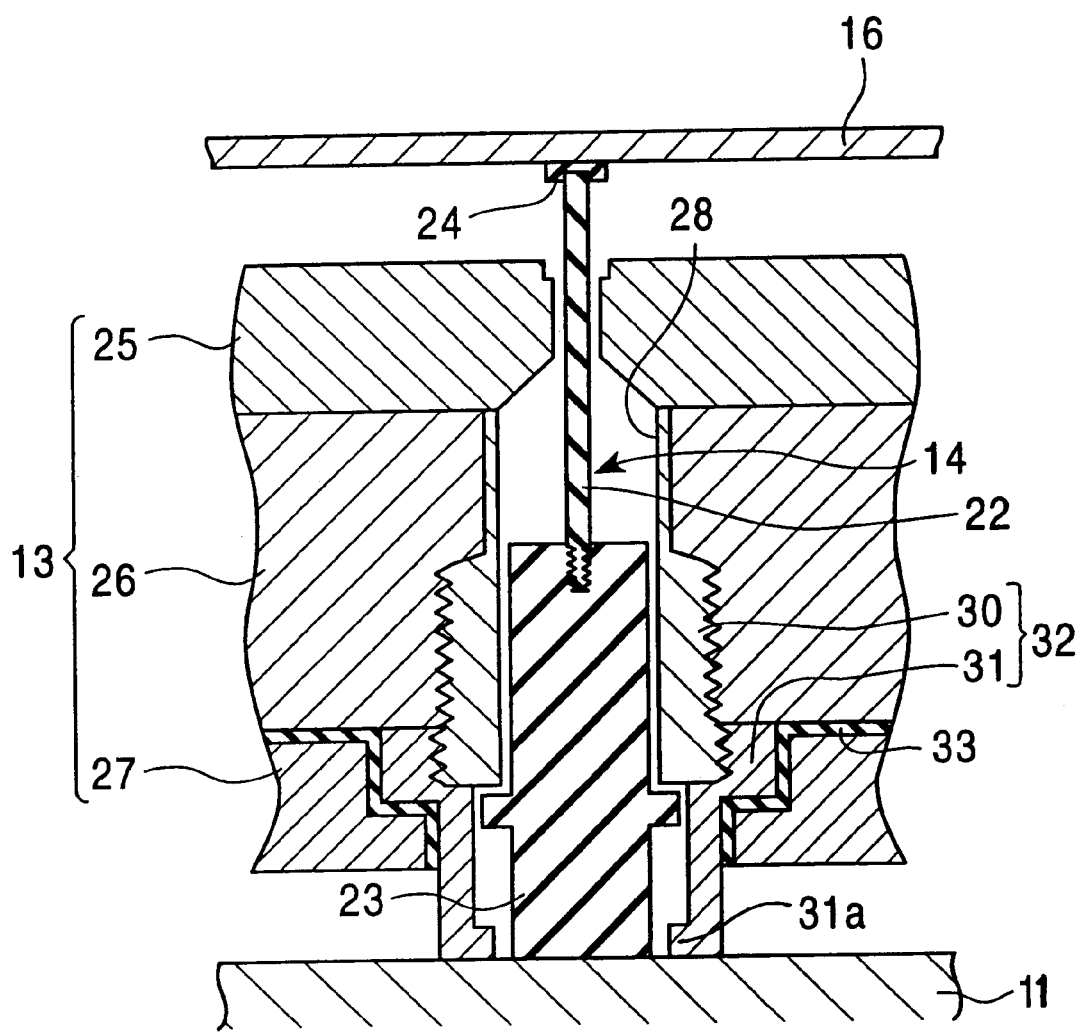
FIG. 4 is a sectional view showing how the susceptor pin section of the plasma CVD apparatus moves.
Figure 5:
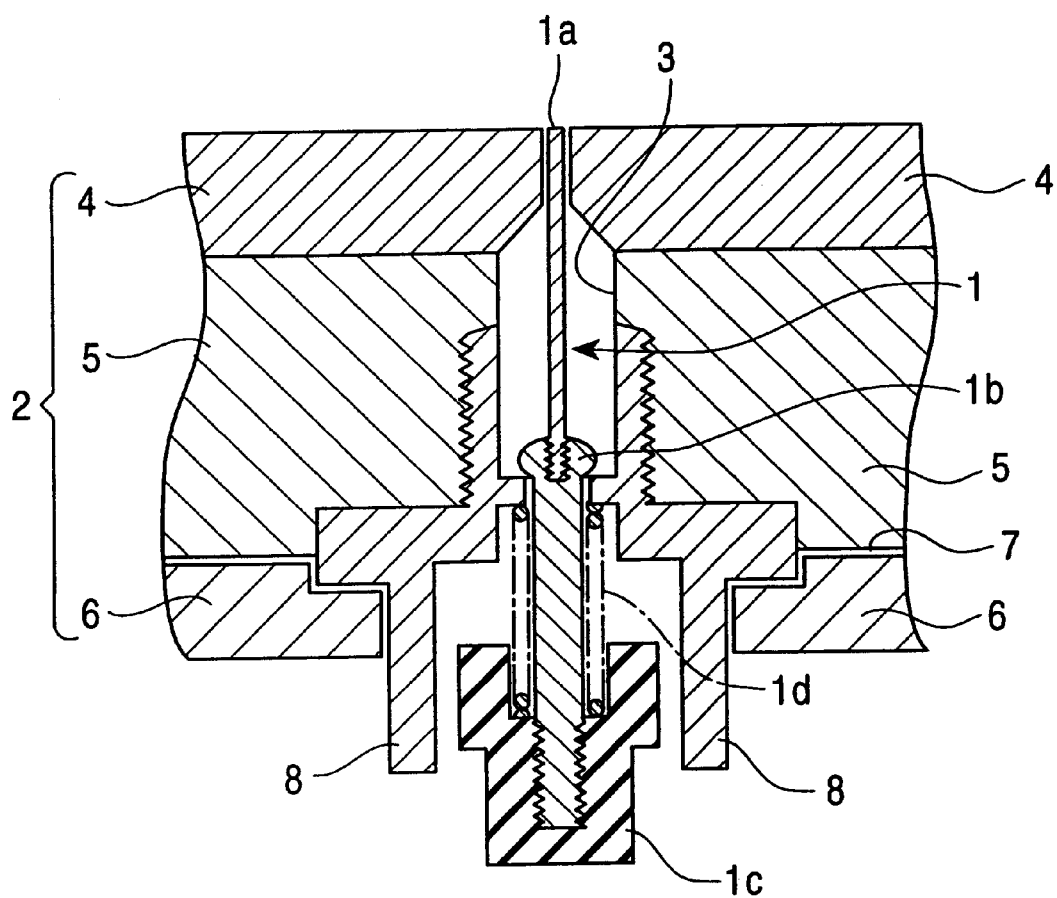
FIG. 5 is a sectional view showing an example of a susceptor pin used to a conventional plasma CVD apparatus.

In an initial state, the susceptor pin 14 is in the state shown in FIG. 4. More specifically, since the lower surface of the shaft 23 of the susceptor pin 14 is abutted against the bottom plate of the chamber 11 in the state that the susceptor 13 falls, the susceptor pin 14 projects from the upper surface of the susceptor 13. In this state, the substrate 16 is loaded using a robot arm or the like.

When the susceptor 13 rises from the state shown in FIG. 4, the susceptor pin 14 falls in the hole 28 by its own weight while being guided by the guide 32. Thus, the enlarged diameter portion 23a of the shaft 23 is abutted against and supported by the stopper 31a as shown in FIG. 2, the cap 24 closes the opening of the hole 28 at the upper end thereof and at the same time the substrate 16 is set on the susceptor 13.

The susceptor 13 further rises and the substrate 16 approaches the RF electrode 12 as shown in FIG. 1 so that a prescribed distance is kept therebetween. A film forming process is performed in this state. When the susceptor 13 falls in the chamber 11 after the completion of the film forming process, the lower end of the shaft 23 of the susceptor pin 14 is abutted against the bottom plate of the chamber 11. When the susceptor 13 further falls in the chamber 11, the susceptor pin 14 rises in the hole 28 while being guided by the guide 32. With this operation, the susceptor pin 14 lifts up the substrate 16 from the susceptor 13 as shown in FIG. 4 so that the substrate 16 is spaced apart from the susceptor 13. In this state, the substrate 16 is unloaded using the robot arm or the like.

In the plasma CVD apparatus 10 of the embodiment, since all the components constituting the susceptor pin 14 are composed of the insulating alumina, the plasma discharge from the susceptor pin 14 can be prevented. Further, since the susceptor pin 14 falls by its own weight as the susceptor 13 rises, a spring which is used conventionally to return the position of the susceptor pin 14 to an initial state when the susceptor 13 rises can be made unnecessary. With this arrangement, since metal components can be removed from the vicinity of the susceptor pin 14, plasma discharge can be prevented in the vicinity of the susceptor pin 14 as well as a reactant can be prevented from being deposited on the susceptor pin 14. As a result, the operation failure of the apparatus such as the defective operation of the susceptor pin 14 is not caused when the susceptor 13 rises, whereby time and effort necessary to the maintenance of the apparatus can be reduced.

Since plasma discharge is prevented in the susceptor pin 14 and its vicinity, there do not arise problems in the formation of a film such as the reduction of a speed at which a film is formed on the substrate 16, the deterioration of film quality, uneven in-plane distribution of the film, and the like, whereby the yield of products can be enhanced.

Further, the provision of the alumina guide 32 can ease the electric field between the guide 32 and the susceptor pin 14 and is more effective to the prevention of plasma discharge.

Since the susceptor pin 14 is composed of the pin main body 22 and the shaft 23 which is engaged with the pin main body 22 so as to be adjusted to freely expand and contract, the height of the susceptor pin 14 can be adjusted by adjusting the engaging state of the pin main body 22 with the shaft 23 as well as even if the pin main body 22 is damaged, the damage can be easily repaired by replacing only the pin main body 22.

In addition, since the lower guide 31 is detachably attached to the upper guide 30, even if the enlarged diameter portion 23a is formed to the shaft 23, the plasma processing apparatus can be easily assembled by such a procedure that the shaft 23 is accommodated in the upper guide 30 first and thereafter the lower guide 31 is attached to the upper guide 30.

In the plasma CVD apparatus 10 of the embodiment, since the plasma leakage preventing member 33 is disposed in the space formed by the susceptor 13, the guide 32 and the susceptor shield 27, the leakage of plasma from the space, where plasma may leak in the conventional structure, can be prevented by plasma leakage preventing member 33 which seals the space.

Since the cap 24 is disposed to the upper end of the susceptor pin 14 to close the hole 28 when the susceptor pin 14 falls, the reliability in operation of the susceptor pin 14 can be improved by making it difficult for dust and pieces of a reactant to enter the hole 28. In addition, since the cap 24 comes into electrical contact with the heating plate 25 in the state that susceptor pin 14 falls, the electric potential of the cap 24 is made equal to the electric potential of the heating plate 25 when they are in contact with each other, whereby the plasma discharge between them can be prevented.

The technical filed of the present invention is by no means limited to the above embodiment and it is possible to make various modifications within the range which does not depart from the gist of the invention. For example, although the plasma leakage preventing member 33 is composed of ceramics such as alumina, aluminum nitride, etc. in the embodiment, materials such as quartz glass, a thermally-sprayed alumina film, etc. may be used in addition to them.

Further, although the CVD apparatus is used in the above description, the arrangement of the susceptor section of the present invention is also applicable to a dry etching apparatus and the like in addition to the CVD apparatus.

As described above, since the susceptor pin and the guide are composed of the insulating ceramics in the plasma processing apparatus of the present invention, plasma discharge can be prevented in the susceptor pin and its vicinity as well as a reactant can be prevented from being deposited on the susceptor pin. As a result, the operation failure of the apparatus is not caused by the defective operation of the susceptor pin when it rises and falls. Therefore, time and effort necessary to the maintenance of the apparatus can be reduced.

There do not arise problems in processing such as the reduction of a processing speed on the substance to be processed, the deterioration of film quality, uneven in-plane distribution of the film, and the like, whereby the yield of products can be enhanced.

When the susceptor pin is composed of the pin main body and the shaft, the height of the susceptor pin can be adjusted as well as even if the pin main body is damaged, the damage can be easily restored by replacing only the pin main body.

Since the guide is composed of the upper guide and the lower guide and the lower guide is detachably attached to the upper guide, the susceptor pin having the shaft to which the enlarged diameter section is formed can be easily mounted on the susceptor.

Since the plasma leakage preventing member is disposed to the space formed by the susceptor, the guide and the susceptor shield, the leakage of plasma can be prevented by the plasma leakage preventing member.

Further, since the cap is disposed to the upper end of the susceptor pin, the reliability in operation of the susceptor pin can be improved as well as since the cap comes into electrical contact with the susceptor in the state that the susceptor pin falls, plasma discharge between the cap and the susceptor can be prevented.

What is claimed is:

1. A plasma processing apparatus, comprising:
   a susceptor pin for supporting a substance to be processed, said susceptor pin being disposed to pass through a hole formed to a susceptor, projecting from the upper surface of the susceptor when the susceptor falls and falling by its own weight when the susceptor rises so as to be buried in the hole said susceptor pin comprising a pin main body and a shaft engaged with the pin main body so that the shaft can be adjusted to freely expand and contract;

an expanded diameter portion formed to said shaft by expanding a part of said shaft, said guide comprised of an upper guide and a lower guide detachably attached to the upper guide, and a stopper disposed to the lower guide so that the stopper is abutted against and supports said shaft when said susceptor pin falls; and a guide for guiding the rising and falling directions of said susceptor pin, wherein said susceptor pin and said guide are composed of ceramics.

2. A plasma processing apparatus according to claim 1, wherein a plasma leakage preventing member is disposed to the space formed by the susceptor, said guide and a susceptor shield disposed to the lower portion of the susceptor.

3. A plasma processing apparatus according to claim 1, wherein a cap is disposed to the upper and of said susceptor pin to close the hole of the susceptor when said susceptor pin falls, and the cap comes into electrical contact with the susceptor in the state that said susceptor pin falls.

4. A plasma processing apparatus according to claim 1, wherein both said pin main body and said shaft are comprised of alumina.

5. A plasma processing apparatus according to claim 1, wherein both said upper guide and said lower guide are comprised of alumina.

6. A plasma processing apparatus according to claim 3, wherein said cap comprises a core having a periphery and said core of said cap is comprised of aluminum and the said periphery of the said core is coated with alumina.

* * * * *